(12) United States Patent
Zhang et al.

(10) Patent No.: US 10,312,266 B2
(45) Date of Patent: Jun. 4, 2019

(54) DISPLAY SUBSTRATE AND MANUFACTURING METHOD THEREOF, AND DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Jun Zhang, Beijing (CN); Gaofei Shi, Beijing (CN); Ru Zhou, Beijing (CN); Jianying Zhan, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 14 days.

(21) Appl. No.: 15/807,632

(22) Filed: Nov. 9, 2017

(65) Prior Publication Data

US 2018/0204854 A1    Jul. 19, 2018

(30) Foreign Application Priority Data

Jan. 13, 2017 (CN) .......................... 2017 1 0024600

(51) Int. Cl.
| | |
|---|---|
| H01L 27/12 | (2006.01) |
| H01L 21/3213 | (2006.01) |
| G02F 1/1368 | (2006.01) |
| G02F 1/1362 | (2006.01) |

(52) U.S. Cl.
CPC ...... *H01L 27/124* (2013.01); *H01L 21/32139* (2013.01); *H01L 27/1262* (2013.01); *H01L 27/1288* (2013.01); *G02F 1/1368* (2013.01); *G02F 1/136227* (2013.01); *G02F 1/136286* (2013.01); *G02F 2001/136295* (2013.01)

(58) Field of Classification Search
None
See application file for complete search history.

(56) References Cited

U.S. PATENT DOCUMENTS

| | | | | |
|---|---|---|---|---|
| 2008/0158635 | A1* | 7/2008 | Hagood | G02B 26/02 359/230 |
| 2016/0380004 | A1* | 12/2016 | Lee | H01L 27/1225 349/46 |

* cited by examiner

*Primary Examiner* — Marcos D. Pizarro
*Assistant Examiner* — Lawrence C Tynes, Jr.
(74) *Attorney, Agent, or Firm* — Nath, Goldberg & Meyer; Joshua B. Goldberg

(57) ABSTRACT

The disclosure discloses a display substrate and a manufacturing method thereof, and a display device, the display substrate comprises a display region and a periphery region, a first electrode line is arranged at the periphery region, an insulating layer is arranged on the first electrode line, a first through hole is provided in the insulating layer at a position corresponding to the first electrode line, a contact electrode is provided in the first through hole, a second electrode line is arranged on the insulating layer, the second electrode line is electrically connected to the first electrode line through the contact electrode. In the disclosure, the contact electrode is provided between the first and second electrode lines, thus when the second electrode line is etched, the first electrode line is protected by the contact electrode from being damaged by etchant, thus saving production cost and improving production efficiency.

18 Claims, 2 Drawing Sheets

DISPLAY SUBSTRATE AND MANUFACTURING METHOD THEREOF, AND DISPLAY DEVICE

CROSS-REFERENCE TO RELATED APPLICATIONS

The present application claims the priority of Chinese Patent Application No. 201710024600.5, filed on Jan. 13, 2017, the contents of which are incorporated herein in their entirety by reference.

TECHNICAL FIELD

The present disclosure relates to a field of display technology, and particularly relates to a display substrate, a manufacturing method of the display substrate, and a display device.

BACKGROUND

A thin film transistor liquid crystal display (referred to as TFT-LCD) has advantages such as small volume, low power consumption, no radiation, and low manufacturing cost, and thus dominates in the current market for a flat panel display. As the image resolution (PPI, pixels per inch) of a product is increasing and a bezel is narrowing, at a periphery region of a display, a new technology is required to achieve connection between signal lines of different layers.

SUMMARY

The present disclosure provides a display substrate, a manufacturing method of the display substrate, and a display device, which at least solve the problem that due to the identical or similar material for signal lines in different metal layers and direct lapping of the signal lines, when one metal layer is etched, the other metal layer is damaged.

As such, the present disclosure provides a display substrate, comprising a display region and a periphery region, wherein the display substrate further comprises: a first electrode line arranged at the periphery region; an insulating layer arranged on the first electrode line; a first through hole provided in the insulating layer at a position corresponding to the first electrode line; a contact electrode provided in the first through hole; and a second electrode line arranged on the insulating layer, and wherein the second electrode line is electrically connected to the first electrode line by the contact electrode.

Optionally, the display substrate further comprises a base substrate, wherein an orthographic projection of the contact electrode on the base substrate covers at least an orthographic projection of a bottom of the first through hole on the base substrate.

Optionally, a length of the orthographic projection of the contact electrode on the base substrate is larger than a length of the orthographic projection of the bottom of the first through hole on the base substrate.

Optionally, a material of the contact electrode includes a metal oxide.

Optionally, the metal oxide comprises indium tin oxide.

Optionally, the first electrode line and a gate at the display region are arranged in a same layer, the contact electrode and a pixel electrode at the display region are arranged in a same layer, and the second electrode line and a source and a drain at the display region are arranged in a same layer.

Optionally, the display substrate further comprises a passivation layer arranged on the second electrode line, wherein a second through hole is provided in the passivation layer, a common electrode is arranged on the passivation layer, and the common electrode is electrically connected to the second electrode line by the second through hole.

A display device comprises the above display substrate.

A manufacturing method of a display substrate, comprising:
depositing a first metal layer on a base substrate;
forming a gate at a display region and forming a first electrode line at a periphery region, by a single patterning process;
depositing an insulating layer;
forming a first through hole in the insulating layer at the periphery region at a position corresponding to the first electrode line by a patterning process;
depositing a conductive material layer;
forming a pixel electrode at the display region and forming a contact electrode in the first through hole at the periphery region, by a single patterning process;
depositing a second metal layer; and
forming a source and a drain at the display region and forming a second electrode line on the insulating layer at the periphery region, by a single patterning process, such that the second electrode line is electrically connected to the first electrode line through the contact electrode.

Optionally, a material of the contact electrode includes a metal oxide.

Optionally, prior to forming a first through hole in the insulating layer at the periphery region at a position corresponding to the first electrode line by a patterning process, the manufacturing method of the display substrate further comprises: forming a semiconductor layer at the display region by a patterning process.

Optionally, the manufacturing method of the display substrate further comprises: forming a passivation layer on the second electrode line such that a second through hole is provided in the insulating layer; and forming a common electrode on the passivation layer such that the common electrode is electrically connected to the second electrode line by the second through hole.

Optionally, an orthographic projection of the contact electrode on the base substrate covers at least an orthographic projection of a bottom of the first through hole on the base substrate.

DETAILED DESCRIPTION

In order to make a person skilled in the art better understand the technical solutions of the present disclosure, a display substrate, a manufacturing method of the display substrate, and a display device according to the present disclosure will be further described in detail in conjunction with the drawings below.

In a conventional solution for a display substrate, a contact hole is generally provided in an insulating layer to achieve lapping of signal lines in different metal layers. However, due to identical or similar material for signal lines in two layers and direct lapping of the signal lines, when one metal layer is required to be etched in a subsequent process, the other metal layer is also eroded by the etchant, thus causing damage to the other metal layer, and even making the other metal layer be completely stripped off.

Figure 1:
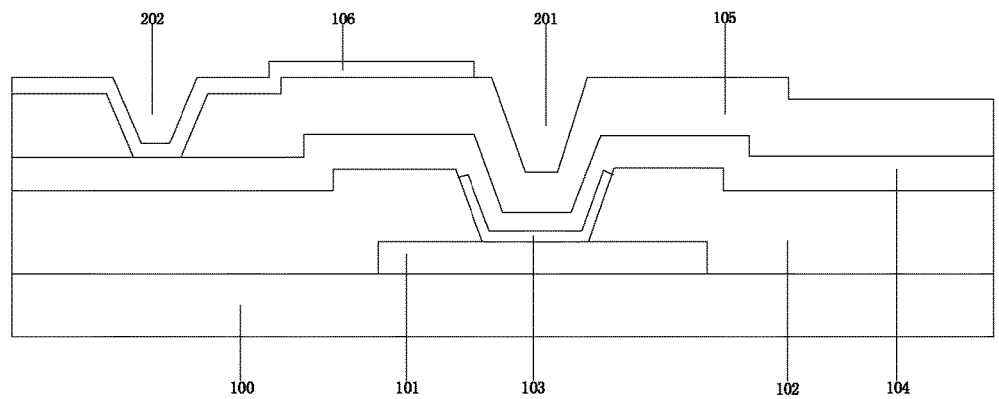
FIG. 1 is a schematic view of a structure of a display substrate according to an embodiment of the present disclosure.

FIG. 1 is a schematic view of a structure of a display substrate according to an embodiment of the present disclosure. As shown in FIG. 1, the display substrate comprises a base substrate 100, the base substrate 100 comprises a display region and a periphery region, a first electrode line 101 is arranged at the periphery region, an insulating layer 102 is arranged on the first electrode line 101, a first through hole is provided in the insulating layer 102 at a position corresponding to the first electrode line 101, a contact electrode 103 is provided in the first through hole, a second electrode line 104 is arranged on the insulating layer 102, the second electrode line 104 is electrically connected to the first electrode line 101 through the contact electrode 103. Optionally, a material of the contact electrode 103 includes a conductive material such as metal oxide and graphene. In the solution of the present disclosure, the contact electrode 103 is provided between the first electrode line 101 at the periphery region and the second electrode line 104, and since the contact electrode 103 covers a bottom of the first through hole, the first electrode line 101 can be prevented by the contact electrode 103 from being damaged by etchant when the second electrode line 104 is etched. Thus, with the solution of the present disclosure, the first electrode line 101 is prevented from being damaged when the second electrode line 104 is etched, without affecting lapping of the first electrode line 101 and the second electrode line 104, thus saving the production cost and increasing the production efficiency.

In an embodiment of the present disclosure, orthographic projections of the first electrode line and the second electrode line on the base substrate are not overlapped with each other, i.e. with an angle therebetween.

Figure 2:
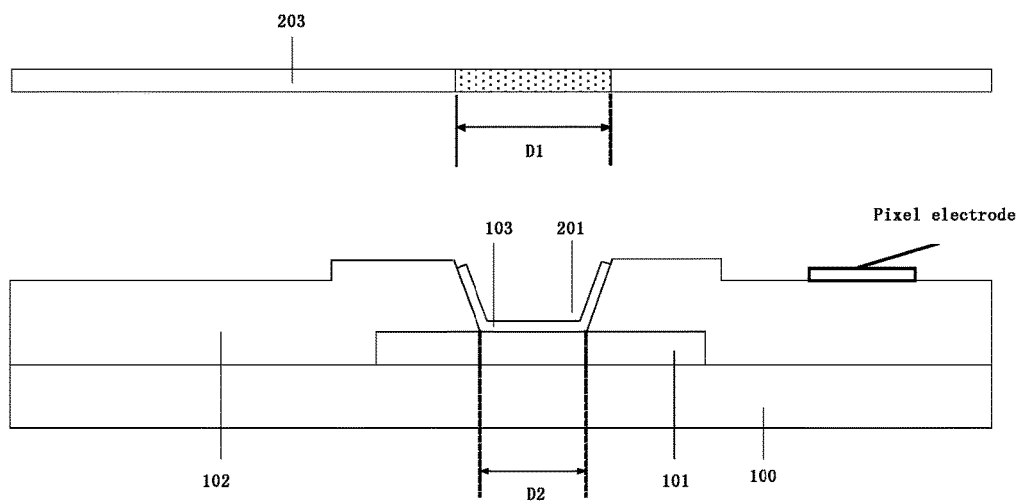
FIG. 2 is a schematic view illustrating formation of a contact electrode in the embodiment.

FIG. 2 is a schematic view illustrating how to form the contact electrode in the embodiment. As shown in FIG. 2, an orthographical projection of the contact electrode 103 on the base substrate 100 covers at least an orthographical projection of the bottom of the first through hole 201 on the base substrate 100. In the embodiment, a pixel electrode is formed at the display region and a contact electrode 103 is formed in the first through hole 201 at the periphery region by a single patterning process, thus a mask plate 203 for the pixel electrode used in the embodiment allows the contact electrode 103 at the first through hole to be maintained at the periphery region such that the contact electrode 103 covers the bottom of the first through hole. In order to make the contact electrode 103 completely cover the bottom of the first through hole, in the embodiment, the length of the orthographic projection of the contact electrode 103 on the base substrate 100 is required to be larger than that of the bottom of the first through hole 201 on the base substrate 100. The length of the orthographic projection of the contact electrode 103 on the base substrate 100 is D1, and the length of the orthographic projection of the bottom of the first through hole 201 on the base substrate 100 is D2. Thus, in the embodiment, D1 is required to be larger than D2. Since the contact electrode 103 can completely cover the bottom of the first through hole 201, when the second electrode line 104 is etched, the first electrode line 101 can be better protected by the contact electrode 103 such that the first electrode line 101 will not be damaged by etchant.

Referring to FIG. 1, a passivation layer 105 is arranged on the second electrode line 104, a second through hole 202 is provided in the passivation layer 105, a common electrode 106 is provided on the passivation layer 105, and the common electrode 106 is electrically connected to the second electrode line 104 by the second through hole 202. In the embodiment, the first electrode line 101 is a gate, and the second electrode line 104 is a source/drain metal layer. Thus, in the embodiment, when the source/drain metal layer is etched, the gate metal can be better protected by the contact electrode 103 from being damaged by etchant.

The display substrate in the embodiment includes a base substrate which includes a display region and a periphery region, a first electrode line is arranged at the periphery region, an insulating layer is arranged on the first electrode line, a first through hole is provided in the insulating layer at a position corresponding to the first electrode line, a contact electrode is provided in the first through hole, a second electrode line is arranged on the insulating layer, the second electrode line is electrically connected to the first electrode line through the contact electrode. In the solution of the present disclosure, the contact electrode is provided between the first electrode line at the periphery region and the second electrode line, and since the contact electrode covers a bottom of the first through hole, the first electrode line can be protected by the contact electrode from being damaged by etchant when the second electrode line is etched. Thus, with the solution of the present disclosure, the first electrode line is prevented from being damaged when the second electrode line is etched, without affecting lapping of the first electrode line and the second electrode line, thus saving the production cost and increasing the production efficiency.

The present disclosure also provides a display device, including the display substrate provided above, and the detailed description thereof may refer to above, and will be omitted herein.

In the display device herein, the display substrate includes a base substrate which includes a display region and a periphery region, a first electrode line is arranged at the periphery region, an insulating layer is arranged on the first electrode line, a first through hole is provided in the insulating layer at a position corresponding to the first electrode line, a contact electrode is provided in the first through hole, a second electrode line is arranged on the insulating layer, the second electrode line is electrically connected to the first electrode line through the contact electrode. In the solution of the present disclosure, the contact electrode is provided between the first electrode line at the periphery region and the second electrode line, and since the contact electrode covers a bottom of the first through hole, the first electrode line can be protected by the contact electrode from being damaged by etchant when the second electrode line is etched. Thus, with the solution of the present disclosure, the first electrode line is prevented from being damaged when the second electrode line is etched, without affecting lapping of the first electrode line and the second electrode line, thus saving the production cost and increasing the production efficiency.

Figure 3:
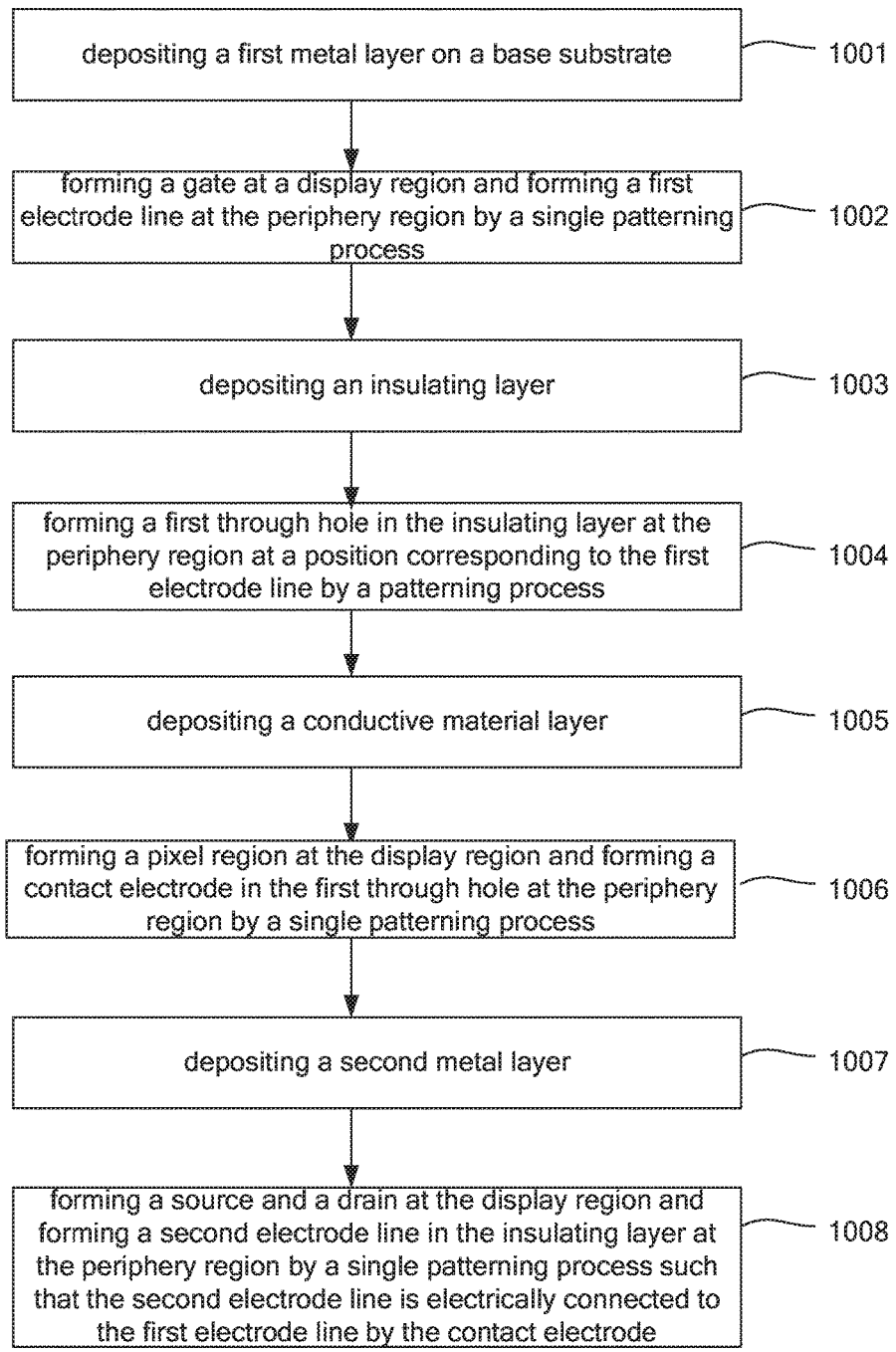
FIG. 3 is a flowchart illustrating a manufacturing method of a display substrate according to an embodiment of the present disclosure.

FIG. 3 is a flowchart illustrating a manufacturing method of a display substrate according to an embodiment of the present disclosure. As shown in FIG. 3, the manufacturing method of the display substrate comprises:

Step 1001, depositing a first metal layer on a base substrate;

Step 1002, forming a gate at a display region and forming a first electrode line at a periphery region, by a single patterning process;

Step 1003, depositing an insulating layer;

Step 1004, forming a first through hole in the insulating layer at the periphery region at a position corresponding to the first electrode line by a patterning process;

Step 1005, depositing a conductive material layer;

Step 1006, forming a pixel electrode at the display region and forming a contact electrode in the first through hole at the periphery region, by a single patterning process;

Step 1007, depositing a second metal layer; and

Step 1008, forming a source and a drain at the display region and forming a second electrode line on the insulating layer at the periphery region, by a single patterning process, such that the second electrode line is electrically connected to the first electrode line through the contact electrode.

Optionally, prior to forming a first through hole in the insulating layer at the periphery region at a position corresponding to the first electrode line by a patterning process, the manufacturing method further comprises: forming a semiconductor layer at the display region by a patterning process. As shown in FIG. 1, in the embodiment, the first metal layer is formed on the base substrate 100, the gate is formed at the display region and the first electrode line 101 is formed at the periphery region by a single patterning process, and the insulating layer is formed on the gate and the first electrode line 101. The semiconductor layer is formed on the insulating layer at the display region, and the first through hole 201 is formed in the insulating layer 102 at the periphery region at a position corresponding to the first electrode line 101 by a patterning process.

A material of the contact electrode includes a conductive material such as metal oxide and graphene. In the embodiment, a material of the contact electrode and a material of the pixel electrode are identical, and are indium tin oxide. In the embodiment, a metal oxide layer is formed on the insulating layer, and a patterning process is performed on the metal oxide layer to form the pixel electrode and the contact electrode 103 such that the pixel electrode is provided on the insulating layer at the display region, and the contact electrode 103 is provided at the bottom of the first through hole at the periphery region. The second metal layer is formed on the contact electrode 103, and a patterning process is performed on the second metal layer to form a source/drain and the second electrode line 104 such that the source/drain are provided on the semiconductor layer at the display region, the second electrode line 104 is provided on the insulating layer at the periphery region, and the second electrode line 104 is electrically connected to the first electrode line 101 by the contact electrode.

Referring to FIG. 2, the orthographical projection of the contact electrode 103 on the base substrate 100 covers at least the orthographical projection of the bottom of the first through hole 201 on the base substrate 100. In the embodiment, the pixel electrode is formed at the display region and the contact electrode 103 is formed in the first through hole 201 at the periphery region by a single patterning process, thus a mask plate 203 for the pixel electrode used in the embodiment allows the contact electrode 103 at the first through hole to be maintained at the periphery region such that the contact electrode 103 covers the bottom of the first through hole. In order to make the contact electrode 103 completely cover the bottom of the first through hole, in the embodiment, the length of the orthographic projection of the contact electrode 103 on the base substrate 100 is required to be larger than that of the bottom of the first through hole 201 on the base substrate 100. The length of the orthographic projection of the contact electrode 103 on the base substrate 100 is D1, and the length of the orthographic projection of the bottom of the first through hole 201 on the base substrate 100 is D2. Thus, in the embodiment, D1 is required to be larger than D2. Since the contact electrode 103 can completely cover the bottom of the first through hole 201, when the second electrode line 104 is etched, the first electrode line 101 can be better protected by the contact electrode 103 such that the first electrode line 101 will not be damaged by etchant.

Referring to FIG. 1, a passivation layer 105 is formed on the second electrode line 104, a second through hole 202 is formed in the passivation layer 105, a common electrode 106 is formed on the passivation layer 105, and the common electrode 106 is electrically connected to the second electrode line 104 by the second through hole 202. In the embodiment, the first electrode line 101 is a gate, and the second electrode line 104 is a source/drain metal layer. Thus, in the embodiment, when the source/drain metal layer is etched, the gate metal can be better protected by the contact electrode 103 from being damaged by etchant.

In the manufacturing method of the display panel in the embodiment, the display substrate in the embodiment includes a base substrate which includes a display region and a periphery region, a first electrode line is arranged at the periphery region, an insulating layer is arranged on the first electrode line, a first through hole is provided in the insulating layer at a position corresponding to the first electrode line, a contact electrode is provided in the first through hole, a second electrode line is arranged on the insulating layer, the second electrode line is electrically connected to the first electrode line through the contact electrode. In the solution of the present disclosure, the contact electrode is provided between the first electrode line at the periphery region and the second electrode line, and since the contact electrode covers a bottom of the first through hole, the first electrode line can be protected by the contact electrode from being damaged by etchant when the second electrode line is etched. Thus, with the solution of the present disclosure, the first electrode line is prevented from being damaged when the second electrode line is etched, without affecting lapping of the first electrode line and the second electrode line, thus saving the production cost and increasing the production efficiency.

It should be understood that, the above embodiments are only exemplary embodiments for the purpose of explaining the principle of the present disclosure, and the present disclosure is not limited thereto. For one of ordinary skill in the art, various improvements and modifications may be made without departing from the spirit and essence of the present disclosure. These improvements and modifications also fall within the protection scope of the present disclosure.

What is claimed is:

1. A display substrate, comprising a display region and a periphery region, wherein the display substrate further comprises:
a first electrode line arranged at the periphery region;
an insulating layer arranged on the first electrode line;
a first through hole provided in the insulating layer at a position corresponding to the first electrode line;
a contact electrode provided in the first through hole; and
a second electrode line arranged on the insulating layer, and wherein the second electrode line is electrically connected to the first electrode line by the contact electrode; and wherein the first electrode line and a gate at the display region are arranged in a same layer, the contact electrode and a pixel electrode at the display region are arranged in a same layer, and the second electrode line and a source and a drain at the display region are arranged in a same layer.

2. The display substrate of claim 1, further comprising a base substrate, wherein an orthographic projection of the contact electrode on the base substrate covers at least an orthographic projection of a bottom of the first through hole on the base substrate.

3. The display substrate of claim 2, wherein a length of the orthographic projection of the contact electrode on the base substrate is larger than a length of the orthographic projection of the bottom of the first through hole on the base substrate.

4. The display substrate of claim 3, wherein the first electrode line and a gate at the display region are arranged in a same layer, the contact electrode and a pixel electrode at the display region are arranged in a same layer, and the second electrode line and a source and a drain at the display region are arranged in a same layer.

5. The display substrate of claim 3, further comprising a passivation layer arranged on the second electrode line, wherein a second through hole is provided in the passivation layer, a common electrode is arranged on the passivation layer, and the common electrode is electrically connected to the second electrode line by the second through hole.

6. The display substrate of claim 2, wherein the first electrode line and a gate at the display region are arranged in a same layer, the contact electrode and a pixel electrode at the display region are arranged in a same layer, and the second electrode line and a source and a drain at the display region are arranged in a same layer.

7. The display substrate of claim 2, further comprising a passivation layer arranged on the second electrode line, wherein a second through hole is provided in the passivation layer, a common electrode is arranged on the passivation layer, and the common electrode is electrically connected to the second electrode line by the second through hole.

8. The display substrate of claim 1, wherein a material of the contact electrode includes a metal oxide.

9. The display substrate of claim 8, wherein the metal oxide comprises indium tin oxide.

10. The display substrate of claim 9, further comprising a passivation layer arranged on the second electrode line, wherein a second through hole is provided in the passivation layer, a common electrode is arranged on the passivation layer, and the common electrode is electrically connected to the second electrode line by the second through hole.

11. The display substrate of claim 8, further comprising a passivation layer arranged on the second electrode line, wherein a second through hole is provided in the passivation layer, a common electrode is arranged on the passivation layer, and the common electrode is electrically connected to the second electrode line by the second through hole.

12. The display substrate of claim 1, further comprising a passivation layer arranged on the second electrode line, wherein a second through hole is provided in the passivation layer, a common electrode is arranged on the passivation layer, and the common electrode is electrically connected to the second electrode line by the second through hole.

13. A display device, comprising the display substrate of claim 1.

14. A manufacturing method of a display substrate, comprising:
    depositing a first metal layer on a base substrate;
    forming a gate at a display region and forming a first electrode line at a periphery region, by a single patterning process;
    depositing an insulating layer;
    forming a first through hole in the insulating layer at the periphery region at a position corresponding to the first electrode line by a patterning process;
    depositing a conductive material layer;
    forming a pixel electrode at the display region and forming a contact electrode in the first through hole at the periphery region, by a single patterning process;
    depositing a second metal layer; and
    forming a source and a drain at the display region and forming a second electrode line on the insulating layer at the periphery region, by a single patterning process, such that the second electrode line is electrically connected to the first electrode line through the contact electrode.

15. The manufacturing method of claim 14, wherein a material of the contact electrode includes a metal oxide.

16. The manufacturing method of claim 14, prior to forming a first through hole in the insulating layer at the periphery region at a position corresponding to the first electrode line by a patterning process, further comprising:
    forming a semiconductor layer at the display region by a patterning process.

17. The manufacturing method of claim 14, further comprising:
    forming a passivation layer on the second electrode line such that a second through hole is provided in the insulating layer; and
    forming a common electrode on the passivation layer such that the common electrode is electrically connected to the second electrode line by the second through hole.

18. The manufacturing method of claim 14, wherein an orthographic projection of the contact electrode on the base substrate covers at least an orthographic projection of a bottom of the first through hole on the base substrate.

* * * * *